United States Patent
Ferguson et al.

(10) Patent No.: US 12,074,241 B2
(45) Date of Patent: Aug. 27, 2024

(54) DIRECT SEMICONDUCTOR SOLAR DEVICES

(71) Applicant: Columbus Photovoltaics LLC, Rego Park, NY (US)

(72) Inventors: Ian Ferguson, Kennesaw, GA (US); Corey E. Lerner, New York, NY (US); Chuanle Zhou, Rolla, MO (US)

(73) Assignee: Columbus Photovoltaics LLC, Rego Park, NY (US)

( * ) Notice: Subject to any disclaimer, the term of this patent is extended or adjusted under 35 U.S.C. 154(b) by 0 days.

(21) Appl. No.: 17/763,980

(22) PCT Filed: Jul. 13, 2020

(86) PCT No.: PCT/US2020/041755
§ 371 (c)(1),
(2) Date: Mar. 25, 2022

(87) PCT Pub. No.: WO2021/066920
PCT Pub. Date: Apr. 8, 2021

(65) Prior Publication Data
US 2022/0376127 A1    Nov. 24, 2022

Related U.S. Application Data (60) Provisional application No. 62/909,424, filed on Oct. 2, 2019.

(51) Int. Cl.
*H01L 31/07*    (2012.01)
*H01L 31/02*    (2006.01)
(Continued)

(52) U.S. Cl.
CPC ...... *H01L 31/07* (2013.01); *H01L 31/022425* (2013.01); *H01L 31/022491* (2013.01);
(Continued)

(58) Field of Classification Search
CPC ............. H01L 31/07; H01L 31/022425; H01L 31/022491; H01L 31/078; H01L 31/0304
See application file for complete search history.

(56) References Cited

U.S. PATENT DOCUMENTS

| | | |
|---|---|---|
| 4,315,097 A | 2/1982 | Solomon |
| 4,435,610 A | 3/1984 | Perlman et al. |

(Continued)

FOREIGN PATENT DOCUMENTS

| | | |
|---|---|---|
| CN | 1862840 A | 11/2006 |
| CN | 102237416 A | 11/2011 |

(Continued)

OTHER PUBLICATIONS

Chem Libre Texts, Workfunction Values (Reference Table), (https://chem.libretexts.org/Ancillary_Materials/Reference/Reference_Tables/Bulk_Properties/B1%3A_Workfunction_Values_(Reference_Table)) downloaded Oct. 20, 2023) (Year: 2023).*

(Continued)

*Primary Examiner* — Jayne L Mershon
(74) *Attorney, Agent, or Firm* — Lerner David LLP (57) ABSTRACT

A photovoltaic cell includes a semiconductor element (20) formed from a direct semiconductor and a transparent biasing agent (28) overlying a first portion of the front face (22) of the semiconductor, the biasing agent producing a first depletion region (30) in the semiconductor element. A collector (40) directly contacts a second portion of the front face. The collector produces a second depletion region (44) in the semiconductor element. The collector (40) is out of direct conductive contact with the biasing agent (28) but in proximity to the biasing agent. A continuous region at least partially depleted of majority carriers extends between the first and second depletion regions at the front face of the semiconductor element. The continuous region may include overlapping portions of the first and second depletion (Continued)

regions (30,44), or may include an additional depletion region (160) formed by a charged dielectric (147).

21 Claims, 3 Drawing Sheets (51) Int. Cl.
    *H01L 31/0224*     (2006.01)
    *H01L 31/0304*     (2006.01)
    *H01L 31/078*     (2012.01)

(52) U.S. Cl.
    CPC ........ *H01L 31/078* (2013.01); *H01L 31/0304* (2013.01); *H01L 31/03046* (2013.01)

(56) References Cited

U.S. PATENT DOCUMENTS

| | | |
|---|---|---|
| 4,800,415 A | 1/1989 | Simmons et al. |
| 2006/0255340 A1 | 11/2006 | Manivannan et al. |
| 2013/0037854 A1 | 2/2013 | Tkachuk |
| 2015/0122317 A1* | 5/2015 | Lerner .................... H01L 31/07 136/255 |
| 2016/0307956 A1 | 10/2016 | Klipstein et al. |
| 2017/0338366 A1* | 11/2017 | Watanabe ............... H01L 24/00 |
| 2020/0075791 A1 | 3/2020 | Chan |

FOREIGN PATENT DOCUMENTS

| | | |
|---|---|---|
| CN | 102832286 A | 12/2012 |
| CN | 102870233 A | 1/2013 |
| CN | 105140330 A | 12/2015 |
| CN | 105874610 A | 8/2016 |
| CN | 109273549 A | 1/2019 |
| EP | 1722419 A1 | 11/2006 |
| GB | 845994 A | 8/1960 |
| JP | s61216466 A | 9/1986 |
| JP | 2016-535944 A | 11/2016 |
| JP | 2020-53679 A | 4/2020 |
| KR | 2008-0010126 A | 1/2008 |
| TW | M514112 U | 12/2015 |
| WO | 8601939 A1 | 3/1986 |

OTHER PUBLICATIONS

International Search Report including Written Opinion for PCT/US2020/041755 mailed Sep. 17, 2020; 13 pages.
Office Action for Japanese Application No. 2022-520593 mailed May 14, 2024. 6 pgs.

* cited by examiner

DIRECT SEMICONDUCTOR SOLAR DEVICES

CROSS-REFERENCE TO RELATED APPLICATIONS

The present application is a national phase entry under 35 U.S.C. § 371 of International Application No. PCT/US2020/041755 filed Jul. 13, 2020, published in English which claims the benefit of U.S. Provisional Patent Application No. 62/909,424, filed Oct. 2, 2019, the disclosures of which are hereby incorporated by reference herein.

BACKGROUND OF THE INVENTION

The disclosures of U.S. patent application Ser. No. 16/436,004, filed on Jun. 10, 2019; U.S. patent application Ser. No. 14/531,037, filed on Nov. 3, 2014; U.S. Pat. No. 10,355,157 and U.S. Provisional Patent Application No. 61/899,400, entitled HIGH BAND GAP SOLAR CELLS WITHOUT SEMICONDUCTOR JUNCTIONS, filed Nov. 4, 2013 are hereby incorporated herein by reference.

The present invention relates to photovoltaic cells i.e., semiconductor devices that can convert light into electrical energy.

Semiconductors have energy levels referred to as the "valence band" and the "conduction band." Electricity is conducted by movement of electrons in the conduction band and positively charged vacancies or "holes" in the valence band. In an "n-type" semiconductor there are more conduction band electrons than holes so that the conduction band electrons are referred to as the "majority carriers." By contrast, in a "p-type" semiconductor, there are more holes than electrons, and hence the holes are the majority carriers. The difference in energy between the valence band and the conduction band is referred to as the bandgap of the semiconductor. Many semiconductors can be made as either n-type or p-type by adding minor amounts of different dopants.

One form of photovoltaic cell is pn junction cell. Such cells incorporate a layer of an n-type semiconductor and a layer of a p-type semiconductor in contact with one another. These layers cooperatively define a p-n junction. Electrodes are provided in contact with the semiconductors on opposite sides of the junction. The Fermi level is an energy level such that the probability of the level being filled with electrons is 50%. If isolated from one another, p-type material and the n-type material have different Fermi levels. The term "normal Fermi level" is used in this disclosure to refer to the Fermi level of a material which is not influenced by contact with another element. In the p-n junction cell, the Fermi levels come into equilibrium with one another by diffusion of electrons from the n-type semiconductor into the p-type semiconductor. This leaves a portion of the n-type semiconductor near the junction positively charged and a portion of the p-type semiconductor near the junction negatively charged. These portions constitute a "space charge region" and create an electric field in the vicinity of the junction. As light impinges on the semiconductor material, absorption of incoming photons promotes electrons from the valence band of the semiconductor material to the conduction band, thus creating an increased number of charge carrier pairs, i.e., a hole in the valence band and an electron in the conduction band.

The electric field of the space charge region accelerates the charge carriers across the p-n junction, driving the additional electrons into the n-type material and additional holes into the p-type material. The holes and electrons move in opposite directions. The electrons pass to a first electrode in contact with the n-type material, whereas the holes pass towards a second electrode in contact with the p-type material. This creates a difference in electrical potential between the electrodes and thus creates useful, available electrical energy at the electrodes. When a load such as a resistor is connected to both electrodes by an external circuit, an electric current flows through the load.

pn junction cells can be readily formed from silicon, and silicon pn junction cells are widely used today to convert solar energy to electricity, such as in rooftop and utility power generation systems. However, silicon has a bandgap of about 1.1 eV (electron volts). Photons of light having energy greater than or equal to the bandgap of the semiconductor will be absorbed, whereas photons having energy less than the bandgap of the semiconductor will pass through the semiconductor. However, when a photon with energy greater than the bandgap is absorbed, the excess energy does no useful work and is wasted. The 1.1 ev bandgap of silicon corresponds to light in the near infrared portion of the spectrum. All of the visible and ultraviolet light in solar radiation is composed of photons with energy greater than the bandgap of silicon. Therefore, the theoretical maximum energy conversion efficiency of a silicon photocell exposed to typical solar radiation at the surface of the earth, as represented by the AMI 1.5 standard spectrum is about 30%.

It is desirable to form photovoltaic cells from materials having wide bandgaps as, for example, about 1.8 electron volts or more. Wide bandgap materials can more efficiently absorb light in the visible and ultraviolet portions of the spectrum. A cell formed from a wide bandgap material can be used in in conjunction with a cell formed from a narrow bandgap material such as silicon. In such a structure, a wide bandgap cell is disposed in front of a narrow bandgap cell. Long wavelength light is not absorbed by the wide bandgap cell and passes through to the narrow bandgap cell, where it is absorbed. For example, a structure with the front cell formed from a semiconductor having a 1.8 eV band gap and a rear cell formed from silicon has a theoretical maximum efficiency of 42% for typical solar radiation.

However, it is difficult to form many wide bandgap semiconductors as p-type materials. Therefore, wide bandgap pn junction cells are too expensive or have too many defects for practical use in solar power systems.

Another type of photovoltaic cell is known as a "Schottky cell." In a Schottky cell, a metallic element forms an interface with a semiconductor referred to as a "Schottky contact." The metallic element also serves as one of the electrodes of the cell, the other electrode being connected to the semiconductor remote from the Schottky contact. The semiconductor typically is entirely n-type or entirely p-type, most commonly entirely n-type. The metallic element is selected so that the metal has a normal Fermi level different from the normal Fermi level of the semiconductor. Where the semiconductor is n-type, the normal Fermi level of the metal is lower than the normal Fermi level of the semiconductor. The Fermi levels of the metal and semiconductor come into equilibrium, by transfer of electrons in the conduction band from the semiconductor adjacent the interface to the metal. This leaves the semiconductor in a "depletion region" adjacent the interface partially or wholly depleted of electrons, and thus positively charged, and leaves the metallic element negatively charged. The electrical potential difference across the depletion region is referred to as the "built-in voltage". In an ideal case with the metal directly abutting the semiconductor and without formation of surface states at the interface, the built-in voltage is equal to the difference between the normal Fermi level of the semiconductor and the normal Fermi level of the metal. In operation, the additional minority carriers (holes in n-type semiconductor) formed in the semiconductor by absorption of light are accelerated toward the interface by the electric field in the depletion region, whereas the majority carriers pass toward the other electrode.

However, Schottky cells suffer from significant drawbacks. When the cell is operated to supply power to an external load connected to the electrodes, a voltage opposing the current flow appears across the load. This load voltage is applied to the electrodes, including the metallic element of the Schottky contact. The load voltage drives carriers in the opposite direction from the direction required for power generation. Moreover, the load voltage reduces the built-in voltage, and reduces the thickness of the depletion region. As further discussed below, the reduction in thickness of the depletion region is particularly significant where the semiconductor is a direct semiconductor. In a direct semiconductor as referred to in this disclosure, a photon is absorbed by a transition of an electron from the valence band to the conduction band that does not require interaction with or generation of another particle or wave. Such a direct transition process should be contrasted with an indirect transition process, which typically involves an interaction which involves a "phonon," i.e., a vibrational wave within the semiconductor, in addition to the photon and the electron.

Direct semiconductors absorb light efficiently. However, carrier recombination, which occurs when an electron drops from the conduction band into the valance band, occurs far more rapidly in direct semiconductors than in indirect semiconductors. Where a carrier pair is formed by absorption of a photon within the space charge region, the carriers are rapidly separated from one another under the influence of the electric field. However, if a carrier pair is generated by absorption of a photon outside of the space charge region, the carrier pair will recombine without ever reaching the electrodes, and all of the energy captured by formation of the carrier pair will be lost. Thus, if the load voltage reduces the thickness of the space charge region to less than the thickness of the region where absorption occurs, the efficiency of the cell drops. Most wide bandgap semiconductors are direct semiconductors. Therefore, Schottky cells using wide bandgap semiconductors have not provided a satisfactory solution.

BRIEF SUMMARY OF THE INVENTION

One aspect of the present invention provides a photovoltaic cell. The cell according to this aspect of the invention desirably includes a semiconductor element formed from a direct semiconductor. The cell according to this aspect of the invention desirably also includes a transparent biasing agent overlying a first portion of the front face of the semiconductor, the biasing agent producing a first depletion region in the semiconductor element. The cell desirably further includes a collector directly contacting a second portion of the front face separate from the first portion, the second portion of the front face being smaller than the first portion of the front face, the collector having a normal Fermi level different from the normal Fermi level of the semiconductor element so that the collector produces a second depletion region in the semiconductor element. For example, the biasing agent may be a metal or a semiconductor having a normal Fermi level different from the normal Fermi level of the semiconductor element, the collector being out of direct conductive contact with the biasing agent but in proximity to the biasing agent. The cell most desirably has a continuous minority carrier channel extending between the first and second depletion regions at the front face. As further discussed below, the minority carrier channel is a region of the semiconductor which is at least partially depleted of majority carriers. The minority carrier channel can be constituted entirely by the first and second depletion regions, where these regions overlap one another. Alternatively, a dielectric material having fixed charges having the same polarity as the majority carriers in the semiconductor may be disposed over the front surface of the semiconductor element in the gap between the biasing agent and the collector, to provide a third depletion region which merges with the first and second depletion regions to form the continuous minority carrier channel. In a further alternative, the biasing agent may be a dielectric material having fixed charges having the same polarity as the majority carriers in the semiconductor. In this case, the biasing agent and the collector may be contiguous or in close proximity to one another, and the continuous minority carrier channel may be formed by merger of the first and second depletion regions. The cell desirably further includes an electrode contacting the semiconductor element at a location spaced apart from the depletion regions.

The semiconductor element desirably includes a portion extending from collector and biasing agent to the electrode, and this portion is entirely p-type or entirely n-type. For example, the entire semiconductor element may be formed entirely of p-type semiconductor or entirely of n-type semiconductor.

Most preferably, the built-in voltage of the first depletion region is greater than the built-in voltage of the second depletion region. As further discussed below, the difference in built-in voltage provides a potential gradient in the lateral direction to drive minority carriers through the minority carrier channel from the first depletion region to the second, and thus drive the minority carriers laterally towards the collector Further aspects of the invention include circuits including photovoltaic cells, methods of photovoltaic conversion and tandem cell structures as further discussed below.

DETAILED DESCRIPTION

Figures 1, 2:
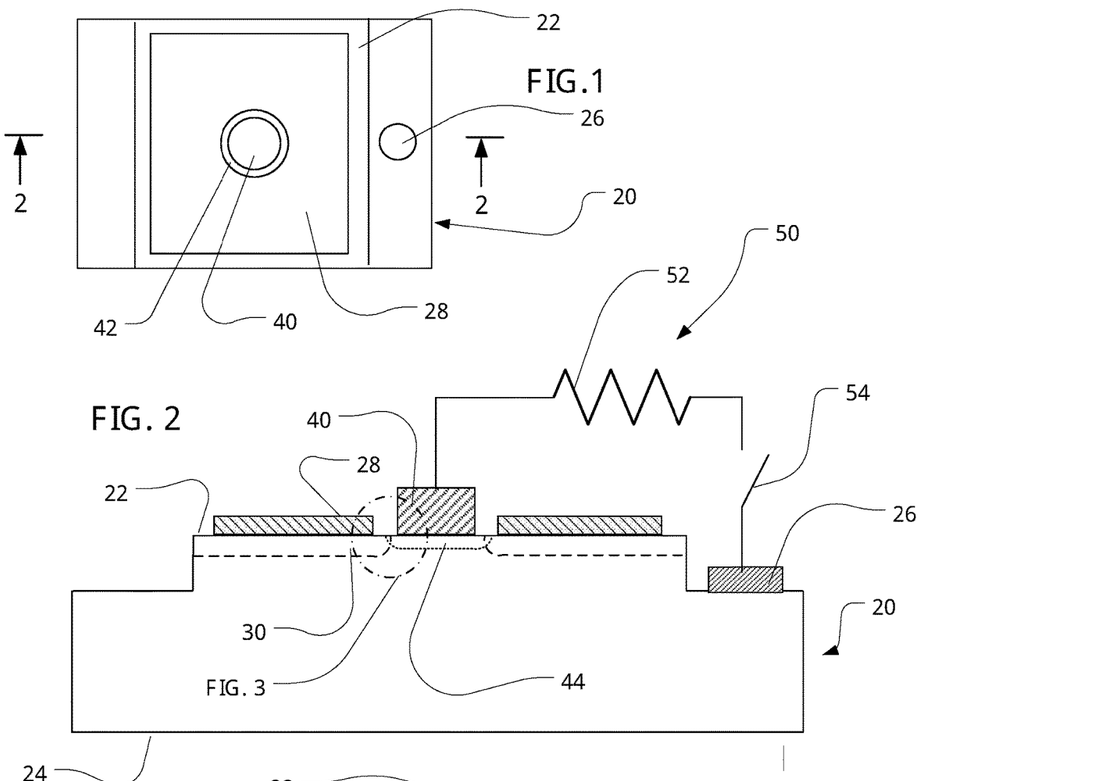
FIG. 1 is a diagrammatic plan view of a cell according to one embodiment of the invention connected to an external circuit.
FIG. 2 is a diagrammatic sectional view taken along line 2-2 in FIG. 1, depicting the cell in conjunction with external circuit elements.
Figure 3:
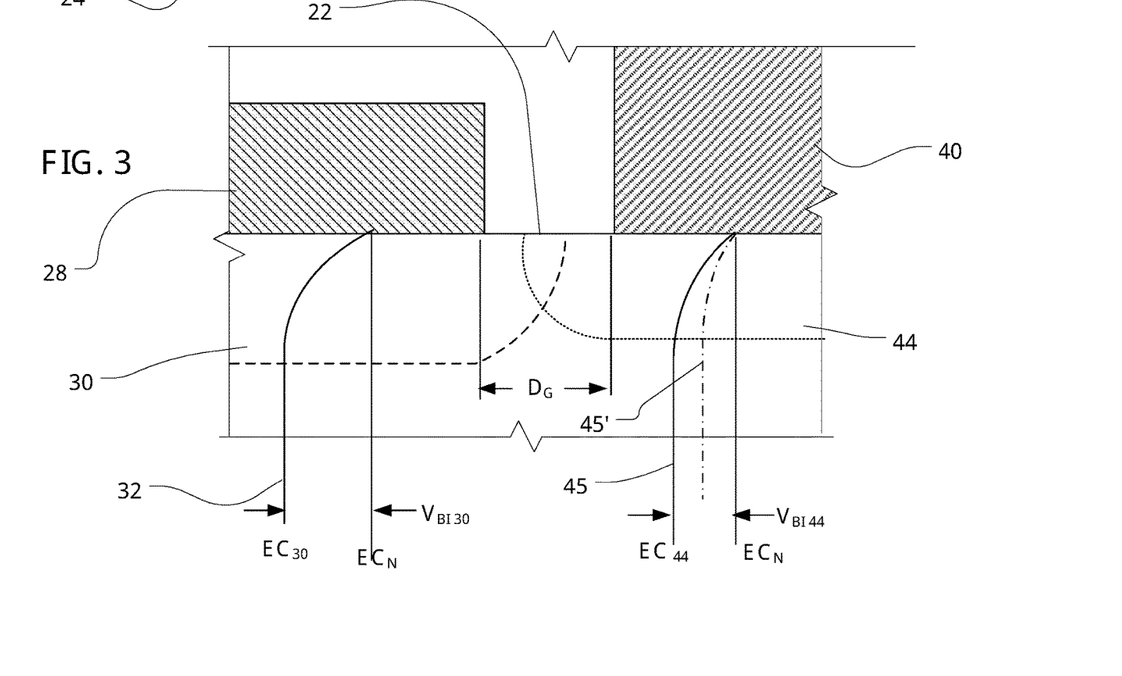
FIG. 3 is an enlarged fragmentary view of the region indicated in FIG. 2.

A cell in accordance with one embodiment of the invention is depicted in FIGS. 1-3. The cell includes a semiconductor element 20 having a front face 22 visible in FIG. 1 and a rear face 24 (FIG. 2) spaced apart from the front face 22 in a thickness direction (the vertical direction in FIG. 2). In this embodiment, the entire semiconductor element is formed from direct semiconductor of a single type of semiconductor, in this case an n-type direct semiconductor. In this disclosure, reference to a type of semiconductor should be understood as stating whether the semiconductor is n-type or p-type when the semiconductor uninfluenced by external elements or fields. Semiconductor element 22 has recesses in its front surface, and one or more electrodes 26 are in contact with the semiconductor element in the recesses. Although only a single electrode is depicted, the electrode may be formed as a plurality of elements which optionally may be conductively connected to one another. Desirably, electrode 26 makes ohmic contact with the semiconductor.

A biasing agent 28 overlies the front surface 22 of the semiconductor element. Biasing agent 28 desirably covers a large portion of the first surface, referred to herein as the "first portion" of the front surface. The biasing agent may be a metal or a semiconductor. In this example, the biasing agent 28 is applied as a layer which is thin enough so that the biasing agent is transparent to light in the wavelengths that are absorbed by the semiconductor, but which has sufficient thickness to form a depletion region as discussed below. Where the biasing agent is a metal, it is typically less than 10 nm thick, most typically 5-10 nm thick. As used in this disclosure, the term "transparent" denotes an element such that a substantial portion of light in the wavelengths of interest will be transmitted through the element. Perfect transparency, i.e., 100% transmission, is not required. The thickness of biasing agent 28 is greatly exaggerated in FIGS. 2 and 3 for clarity of illustration. In the embodiment depicted, the biasing agent is in direct contact with the front surface of the semiconductor, with no intervening material between the biasing agent and the semiconductor. In other embodiments, a thin layer of a dielectric may be provided between the biasing agent and the semiconductor front surface, provided that the layer of dielectric is thin enough to allow electrons to penetrate the layer by tunneling.

As further discussed below, in a circuit incorporating the cell, the biasing agent 28 is not directly conductively connected to any element of the circuit other than the semiconductor. In particular, the biasing agent is not conductively connected between the semiconductor element and a load in the circuit. Thus, the biasing agent does not act as an electrode of the cell, and does not carry the photocurrent generated by the cell during operation. Preferably, the biasing agent has no terminal adapted for conductive connection to an external circuit element. Where a dielectric passivating layer (not shown) is provided over the front surface of the cell, the passivating layer desirably covers the entirety of the biasing agent, so that the biasing agent is physically inaccessible for connection to any external circuit element.

In this embodiment, the semiconductor element 20 is n-type, and biasing agent 28 has a normal Fermi level $E_{FM}$ below the normal Fermi level $E_{FS}$ of the semiconductor. Stated another way, the work function $\Phi m$ of the biasing agent is greater than the work function of the semiconductor in its normal state. The work function of a material is the energy required to move an electron from the Fermi level of the material to a vacuum. The work function of a metal is also referred to as the "electron affinity" of the metal.

The biasing agent 28 produces a first depletion region 30 in the semiconductor adjacent the front surface. This depletion region extends behind first region of the front surface covered by the biasing agent. As diagrammatically shown in FIG. 3, the first depletion region also extends laterally, in directions parallel to the front surface of the semiconductor, beyond the edges of the biasing agent. The mechanism of formation of the first depletion region is the similar to the mechanism of formation in a Schottky contact. Because electrons can be transferred between the semiconductor and the biasing agent, the Fermi levels of the biasing agent and the semiconductor at the interface between them must come into an equilibrium state where both levels are the same. For this to occur, electrons are transferred from the semiconductor to the biasing agent. This leaves the semiconductor throughout the region adjacent the front surface 22 depleted in electrons, and thus positively charged, and leaves the biasing agent negatively charged. Where the biasing agent is metallic, the charge in the biasing agent is concentrated in an extremely thin region, typically a few Angstroms thick, referred to as the "delta charge region" (not shown) abutting the front surface of the semiconductor. An electron in the conduction band of the semiconductor adjacent the front surface is repelled by the negative charge on the biasing agent. At progressively greater distances from the front surface, the repulsion is reduced by progressively greater amounts of positively charged semiconductor intervening between the biasing agent and the electron. Stated another way, there is an electric field within the first depletion region 30 of the semiconductor.

An electron in the conduction band of the semiconductor within the depletion region has additional potential energy imparted by the electric field and thus is at a higher energy level than an electron in the conduction band outside the depletion region. This is represented in FIG. 3 by curve 32, depicting the energy level of the conduction band. At the interface between the semiconductor and the biasing agent, the energy level $E_C$ of an electron in the conduction band is at the normal value ECN for the semiconductor uninfluenced by the biasing agent. In the region of the semiconductor outside of the depletion region, the energy level of an electron in the conduction band is at a more positive value $EC_{30}$. The energy level $E_C$ declines progressively with increasing distance from the interface, reaching $EC_{30}$ at the boundary of the depletion region. The rate of decline with distance represents the strength of the electric field within the semiconductor in depletion region 30; this value reaches zero at the boundary of the depletion region. Because the bandgap is a fixed quantity, the energy level of the valence band follows a curve (not shown) identical to curve 32, but at a lower energy level. The term "band bending" is commonly used to describe the distortion of the energy levels within the depletion region. The depletion region is also referred to as a "space charge region" or as a "depletion zone".

The magnitude of the bending in these curves is equal to the difference between $EC_{30}$ and ECN, and is referred to as the built-in voltage Vim 30 of the first depletion region 30. In an "ideal" case, where the biasing agent is in direct contact with the semiconductor with no intervening tunneling dielectric layer, and where surface states at interface do not influence the barrier height, the built-in voltage $V_{BI\,30}$ is equal to the difference between the normal Fermi levels of the semiconductor 20 and the biasing agent 28. The dimensions of the depletion region depend upon the carrier concentration of the semiconductor as well as the built-in voltage and the dielectric constant of the semiconductor, and are readily calculable by those skilled in the art.

The cell further includes an electrically conductive collector 40. Collector 40 is in direct contact with the semiconductor in a second portion of the front surface 22 of the semiconductor. The second portion of the front surface is separate from the first portion covered by biasing agent 28. However, the two surface portions are in close proximity with one another, so that there is a small gap distance $D_G$ (FIG. 3) between the biasing agent 28 and the collector 40 at the front surface 22 of the semiconductor. In this embodiment, collector 40 is disposed in an opening 42 in the biasing agent, but this configuration is not essential. Collector 40 preferably is opaque. Collector 40 includes a metal having disposed at the interface with the semiconductor, this metal having a Fermi level different from the normal Fermi level of the semiconductor and forming a Schottky contact with the semiconductor. In the embodiment depicted, collector 40 is a unitary mass of a single metal, but the collector may include multiple layers of different metals. Collector 40 is adapted to serve as a terminal for connection to an external circuit.

Collector 40 forms a second depletion region 44 in the semiconductor. This depletion region extends behind the second region of the front surface covered by the collector. As diagrammatically shown in FIG. 3, the second depletion region also extends laterally, in directions parallel to the front surface of the semiconductor, beyond the collector 40. In this embodiment, the sum of the lateral extent of the second depletion region 44 beyond collector 40 and the lateral extent of the first depletion region 30 beyond biasing agent 30 is greater than the gap distance $D_G$, so that the first and second depletion regions merge with one another. The merged depletion regions form a continuous minority carrier channel extending between the first and second depletion regions.

Curve 45 diagrammatically depicts the energy level of the conduction band in second depletion region 44. Desirably, the built-in voltage $V_{BI\,44}$ of the second depletion region 44 is less than the built-in voltage $V_{BI\,30}$ of the first depletion region 30. Thus, adjacent the front surface 22 of the semiconductor, there is a laterally-directed electric field component across the gap between the biasing agent 28 and the collector 40. This laterally directed field component will tend to accelerate the minority carriers (holes, in n-type semiconductor) laterally toward the collector 40, from the first depletion region 30 to the second depletion region 44. The laterally-directed field component will direct majority carriers (electrons) in the opposite lateral direction, away from the collector.

The cell as described above is under open-circuit, dark conditions. In use, the cell is connected to external circuit elements 50, such as a load 52 in series with a switch 54 to form a circuit including the load 50 and the cell. When the circuit is in an operative condition, with switch 54 closed, the load is conductively connected between the collector 40 and the electrode 26. Light passes into the semiconductor body through the biasing agent. As the light is absorbed by the semiconductor, it promotes electrons from the valence band to the conduction band, thus creating additional carriers, i.e., electrons and holes, within first depletion region 30. The electric field component in the thickness direction within the first depletion region drives the additional carriers in opposite directions. The minority carriers (holes) are driven toward the front surface of the semiconductor, whereas the majority carriers (conduction-band electrons) are driven away from the front surface, into the bulk of the semiconductor outside of depletion region 30. At the same time, the holes are impelled laterally toward the second depletion region 44 and collector 40 by the laterally directed electric field. Moreover, because collector 40 is opaque, very little or no light reaches the second depletion region 44. Therefore, essentially no additional carriers are created in the second depletion region 44. The concentration of holes in the second depletion region will be much lower than the concentration of holes in the first depletion region 30. The hole concentration gradient between the first and second depletion region creates a diffusion current of the holes formed in the first depletion region into the second depletion region and toward the collector.

Because the depletion regions have a low concentration of the majority carriers (electrons), electron-hole recombination is limited. The continuous minority carrier channel assures that minority carriers formed within the first depletion region 30 can pass to the second depletion region 44 without passing through a region of the semiconductor having a high concentration of majority carriers. Moreover, because the minority carriers (holes) are driven by the electric field and the concentration gradient, the time required for the minority carriers to reach this collector is minimized, thus further limiting recombination losses. The majority carriers (electrons) pass into the bulk of the semiconductor and diffuse to electrode 26. The flow of minority carriers to collector 40 and majority carriers to electrode 26 constitutes the desired photocurrent in the cell.

There is essentially no electric field in the semiconductor outside of the depletion regions. Therefore, if a carrier pair is formed in the bulk region of semiconductor element 20, outside of depletion regions 30 and 44, the carriers will more solely by diffusion. Because the carrier recombination time of a direct semiconductor is very short, and because the bulk region has a high concentration of majority carriers, essentially all of the minority carriers generated by absorption of light outside of the depletion regions will be lost by recombination. Most preferably, most of the light passing through the biasing agent 28 is absorbed within the first depletion region 30. Stated another way, the thickness of the first depletion region most preferably is greater than thickness of the absorption region of the semiconductor, and more preferably at least about twice the thickness of the absorption region. The light intensity $I_X$ at a depth X from the front surface 22 of the semiconductor is given by the equation:

$$I_X = I_0 e^{-\alpha X}$$

Where:
$I_0$ is the intensity of the light at front surface 22; and
α is the absorption coefficient of the semiconductor for the light impinging on the semiconductor. Unless otherwise specified in this disclosure, the value of a should be taken as an average value for that portion of solar radiation having energy greater than the bandgap of the semiconductor.

As used in this disclosure the thickness $t_A$ of the absorption region is taken as equal to the depth x equal to $\alpha^{-1}$. At this depth, $I_X/I_0$ is equal to $e^{-1}$ or about 0.37. Stated another way, $t_A$ is the depth x at which about 63% of the incoming photons have been absorbed. At a depth x equal to twice $t_A$, $I_X/I_0$ is about 0.14, so that 86% of the incoming photons have been absorbed. Merely by way of example, in a zinc oxide semiconductor, $t_A$ is on the order of 100 nanometers.

When switch 54 is closed and the cell is illuminated, current passes from collector 40 through load 52 of the external circuit 50 to electrode 26. Stated another way, electrons flow from electrode 26 to collector 40. The voltage across load 52 appears as an external bias voltage between the collector 40 and electrode 26. This external bias imposed by the load counteracts the electric field within the second depletion region imposed by the Schottky contact between the collector and the semiconductor. This effectively reduces the built-in voltage and the dimensions of the second depletion region 44, as indicated schematically by curve 45'(FIG. 3). Desirably, despite the reduction in the dimensions of the second depletion region under load, there is still some overlap with the first depletion region, so that the continuous minority carrier channel remains intact under load conditions. However, because the biasing agent 28 is not conductively connected to the collector 40 other than through the semiconductor, the external bias applied by the load voltage is not directly applied to the biasing agent, so that the built-in voltage and dimensions of the first depletion region 30 remain substantially unaffected.

Additionally, the external bias voltage tends to generate a current opposite to the photocurrent as some majority carriers from the bulk region of the semiconductor move toward the front of the cell, against the electric field in the depletion region. This reverse current reduces the photocurrent flowing in the cell. However, because the external bias voltage is applied to collector 40 and not to the biasing agent 28, this effect will occur primarily in regions of the semiconductor body aligned with collector 40. These regions constitute a relatively small portion of the cell. Additionally, the action of the laterally-directed electric field driving majority carriers from the second depletion region toward the first depletion region discussed above reduces the reverse current. Moreover, because collector 40 is opaque in this embodiment, these regions of the semiconductor are substantially unilluminated. There is little or no carrier formation in the regions of the semiconductor aligned with the collector and therefore these regions will have low carrier concentration. Thus, the reverse current will be smaller than it would be in a comparable cell having a transparent collector.

The cells discussed herein are referred to as "isolated collection and biasing system" cells or "ICBS" cells, in that the collector and the biasing agent are not directly conductively connected to one another. As discussed above, the only connection between the collector and the biasing agent is through the semiconductor. In an ICBS cell, the depth of the first depletion region is substantially unaffected by the bias voltage applied by the load during operation. Moreover, the reverse current induced by the load is smaller than the reverse current in an otherwise comparable Schottky cell. Additionally, the separate biasing agent and collector allow for use of different materials in these elements, so that the materials in each element can be optimized for its particular function with the semiconductor. These advantages are further illustrated by Example 1, below.

Example 1

Numerous ICBS cells generally in accordance with the embodiment discussed above with reference to FIGS. 1-3 were formed using n-type gallium arsenide semiconductor, an opaque collector formed from gold and a biasing agent formed from silver. The collectors of the various ICBS cells were of different shapes. Each ICBS cell had a gap of about 100 nm between the collector and the biasing agent, so that the collector and the biasing agent were not directly conductively connected to one another, but a continuous minority carrier channel extended between the first and second depletion regions as discussed above. The ICBS cells were tested. Schottky cells were formed from the ICBS cells by connecting a metallic shunt between the collector and the biasing agent of each cell, so that the collector and biasing agent formed a composite Schottky contact. The shunt was not in contact with the semiconductor. Thus, the Schottky cells were identical to the ICBS cells apart from the presence of the shunt. The performance of the ICBS cells and Schottky cells was measured using the same illumination and the same measuring equipment. The results are shown in the table below.

| Cell structure | $R_S$ (Ω) | $R_{sh}$ (kΩ) | $\phi_B$ (meV) | $J_0$ (μA/cm$^2$) | $V_{OC}$ (mV) | $J_{SC}$(mA/cm$^2$) Whole Cell | FF (%) |
|---|---|---|---|---|---|---|---|
| Schottky | 5.3 | 25.6 | 743 | 0.17 | 379 | 1.41 | 52.5 |
| ICBS | 4.8 | 496 | 791 | 0.04 | 428 | 2.05 | 66.8 |

In the table, $R_S$ is the series resistance, $R_{sh}$ is the shunt resistance, $\phi_B$ is barrier height, $J_0$ is reverse saturation current, $V_{OC}$ is open circuit voltage, $J_{SC}$ is short circuit current and FF is the fill factor. The fill factor is the ratio of maximum obtainable power to the product of the open-circuit voltage and short-circuit current. Each value in the table is the average for the ICBS cells or the average for the Schottky cells, as labelled in the column "Cell Structure."

The ICBS cells had higher VOC, higher JSC and higher FF than the Schottky cells, and thus the ICBS cells generated substantially more electrical power than the Schottky cells.

Figure 4:
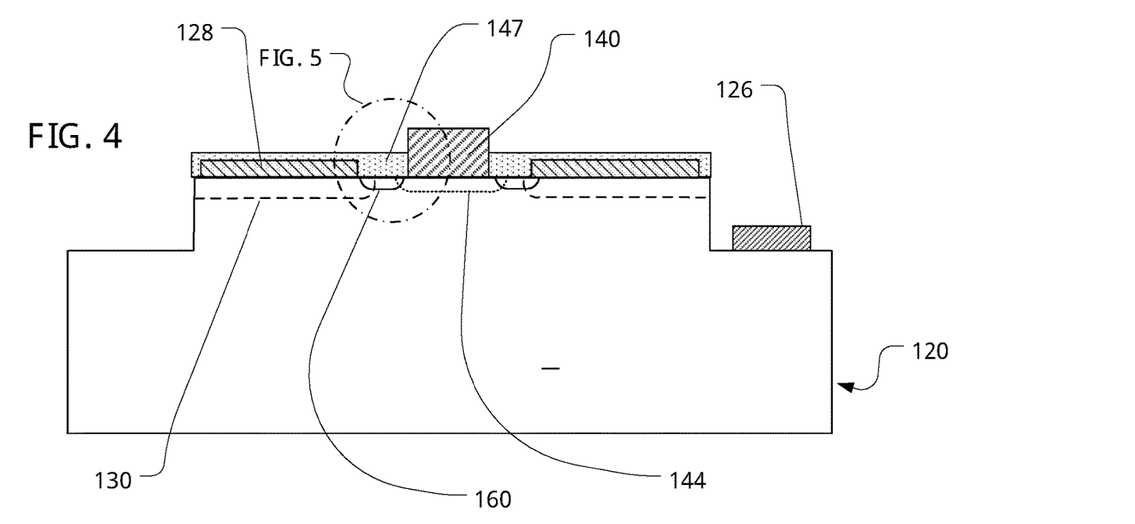
FIG. 4 is a view similar to FIG. 2 but depicting a cell in accordance with another embodiment of the invention.
Figure 5:
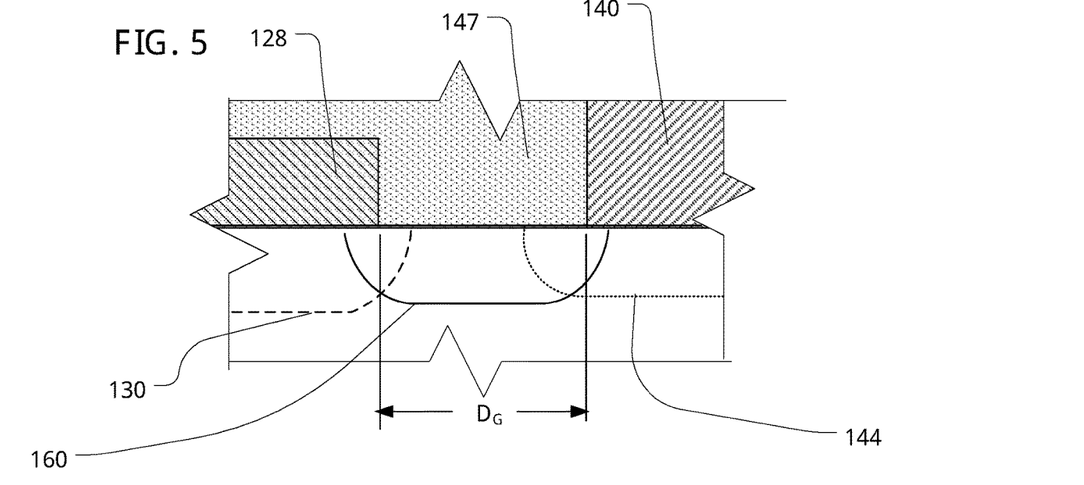
FIG. 5 is an enlarged fragmentary view of the region indicated in FIG. 4.

A cell according to a further embodiment of the invention (FIGS. 4 and 5) incorporates a semiconductor element 120, electrode 126, biasing agent 128 and collector 140 as discussed above with reference to FIGS. 1-3. Here again, the biasing agent 128 forms a first depletion region 130, and the collector 140 forms a second depletion region 144. In the cell of FIGS. 4-5, a dielectric 147 having a fixed electrical charge is provided in the gap between the biasing agent 128 and the collector. The charge in dielectric 147 is such that is repels the majority carriers in the semiconductor. For example, where the semiconductor element is n-type, the fixed charges in the dielectric adjacent the semiconductor are negative. The charged dielectric thus induces a further depletion region 160 in a small region of the semiconductor aligned with the gap. This additional depletion region overlaps with the first depletion region 130 and the second depletion region 144, so that a continuous minority carrier channel including the first and second depletion regions exists even if the gap distance $D_G$ between the biasing agent 128 and the collector 140 is such that the first depletion region 130 does not overlap with the second depletion region. Stated another way, the gap distance $D_G$ between the biasing agent 128 and the collector 140 may be greater than the sum of the lateral extent of the first depletion region beyond the biasing agent 128 and the lateral extent of the second depletion 144 region beyond the collector 140. Because the gap distance DG may be relatively large, the precision required in the processes used to form the collector and biasing agent can be reduced. Moreover, the continuous minority carrier channel can be maintained under severe load conditions.

The dielectric 147 may serve as a passivation layer covering the biasing agent 128, as best seen in FIG. 4. The charges in the dielectric which induce the additional depletion region 160 may be formed as surface charges at the interface between the dielectric and the semiconductor. In a further variant, the dielectric may be an electret, i.e., a dielectric such as an organic dielectric having separated fixed positive and negative charges. Where the semiconductor element is n-type, the negative charges would be disposed adjacent the semiconductor, and the positive charges would be disposed remote from the semiconductor.

Figure 6:
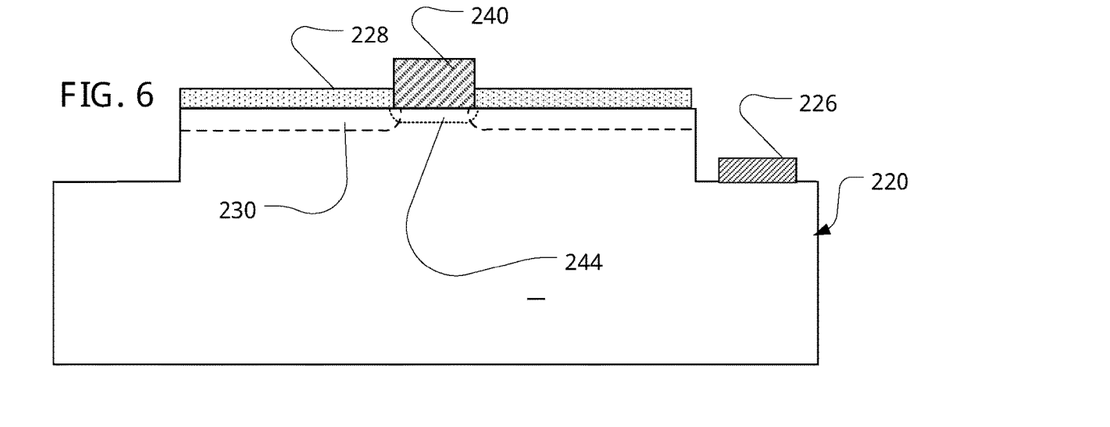
FIG. 6 is a view similar to FIG. 2 but depicting a cell according to yet another embodiment of the invention.

A cell according to a further embodiment of the invention (FIG. 6) includes a semiconductor element 220, electrode 226 and collector 240 similar to the corresponding elements discussed above. In the cell of FIG. 6, the biasing agent is a dielectric having fixed charges therein. The dielectric used in this embodiment may be similar to the dielectric discussed above with reference to FIGS. 4 and 5. In this case, the dielectric induces the first depletion region 230 by repulsion of the minority carriers. Because the biasing agent is a dielectric, the biasing agent 230 may touch the collector 240 without establishing a conductive connection with the collector. Stated another way, the first region of the semiconductor front surface occupied by the biasing agent may be contiguous with the second region of the semiconductor front surface occupied by the collector. Because the biasing agent can be formed close to or contiguous with the collector, the gap distance between the collector and the biasing agent may be small or non-existent. This facilitates formation and maintenance of a continuous minority carrier channel including the first and second depletion regions. A cell according to this embodiment can be fabricated by forming the dielectric biasing agent to leave one or more spaces where the collector is to be deposited, and then depositing the collector into these one or more spaces, to completely fill the spaces. Such a process does not require precise control of the collector deposition process.

Figures 7, 8:
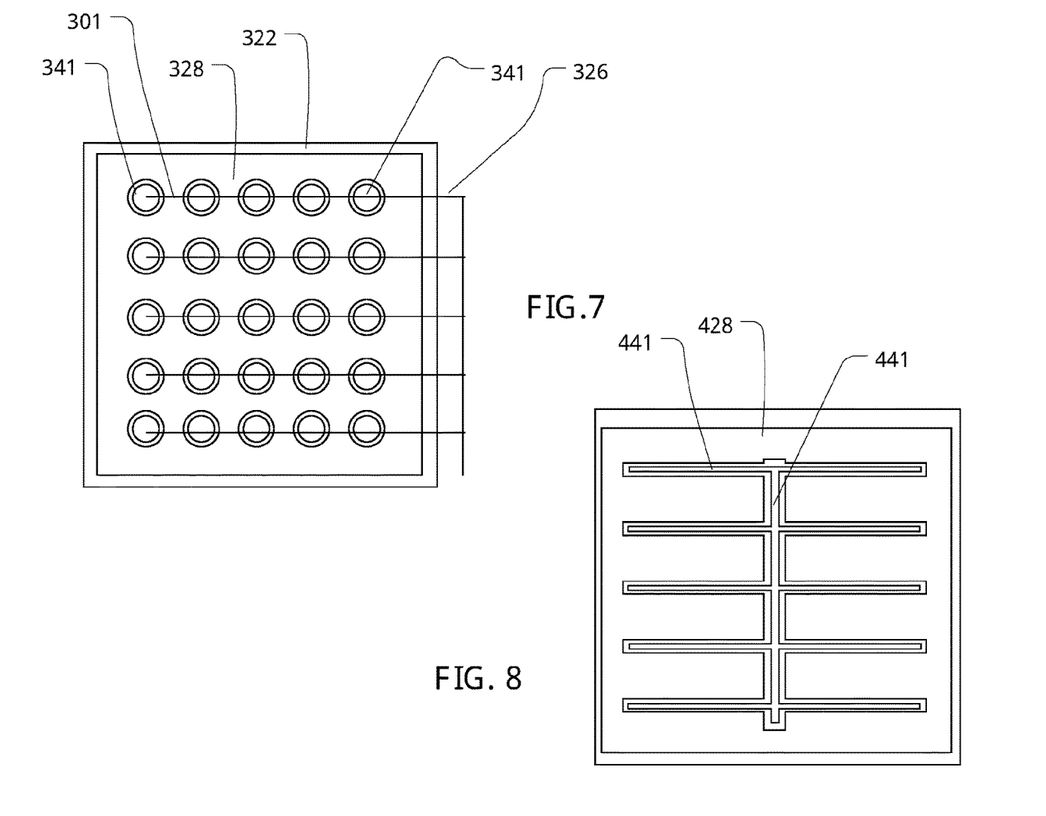
FIGS. 7 and 8 are diagrammatic plan views depicting elements of cells according to still further embodiments of the invention.

In any of the embodiments discussed herein, the collector may be formed in a configuration which includes plural elements distributed over the front surface of the cell. For example, the cell of FIG. 7 includes a collector formed as a plurality of separate collector elements 341, each contacting the front surface of the semiconductor element through an opening in the biasing agent 328. The collector elements 341 are conductively connected to one another by conductors such as wires or traces 301. In a further variant (FIG. 8) the collector elements 441 include elongated strips extending in slots formed in the biasing agent 428, the collector elements being conductively connected to one another. In these and other embodiments using a multi-element collector, the conditions discussed above required to maintain a continuous minority carrier channel between the first depletion region formed by the biasing agent and the second depletion region formed by the collector, without forming a conductive connection between the collector and the biasing element, are provided along each boundary between the elements of the collector and the biasing agent. Whether the collector includes a single element or multiple elements, the collector desirably occupies only a small part of the front surface of the semiconductor element. Desirably, the biasing agent occupies at least about 75% of the front surface. The ratio of the area of the first region, covered by the biasing agent, to the area of the second region, covered by the collector, desirably is at least about 5:1, more desirably about 7:1 or more. The embodiments of FIGS. 7 and 8 include an electrode (not shown) similar to the electrode 26 to receive the majority carriers; the electrode in these embodiments may be disposed on any surface of the semiconductor as, for example, on the rear surface of the cell.

In the embodiments of FIGS. 1-6, the electrode is disposed in a recess in the front surface of the semiconductor element, but this is merely exemplary; the front surface of the semiconductor element may be planar, with the electrode disposed on a part of the front surface not occupied by the biasing agent or collector; on the rear surface of the semiconductor element, or at any other location remote from the biasing agent, collector and depletion regions.

In the embodiments discussed above, the entire semiconductor element is formed entirely from an n-type semiconductor. Where a suitable direct semiconductor is available as a p-type, the entire element can be formed from p-type semiconductor. The collector and biasing element in such an embodiment would have a higher Fermi level (lower work function) than the semiconductor to form the depletion regions. If a dielectric with fixed charge is used to form a depletion region, the dielectric would have positive charge.

In the embodiments discussed above, the entire semiconductor element is formed entirely of one type of semiconductor. However, the semiconductor element may include regions of the opposite type outside of the region forming the cell.

The cells discussed above can provide effective photovoltaic conversion and can be fabricated using readily available direct semiconductors, including wide bandgap semiconductors. Suitable semiconductors include III-V semiconductors and II-VI semiconductors. Examples of III-V semiconductors are those including one or more elements selected from the group consisting of as gallium, indium, and aluminum and one or more elements selected from the group consisting of nitrogen, phosphorous, arsenic, and antimony. Examples of II-VI semiconductors are those including metals selected from the group consisting of cadmium, zinc, mercury and cobalt and one or more elements selected from the group consisting of as oxygen, sulfur, selenium, and tellurium. Other elements, such as transition metal and rare earth elements can be alloyed with III-V and II-VI semiconductors to modulate the bandgap. Thus, as used in this disclosure, the terms "III-V semiconductor" and "II-VI semiconductor" refer to such semiconductors with or without alloying elements unless otherwise specified.

Figure 9:
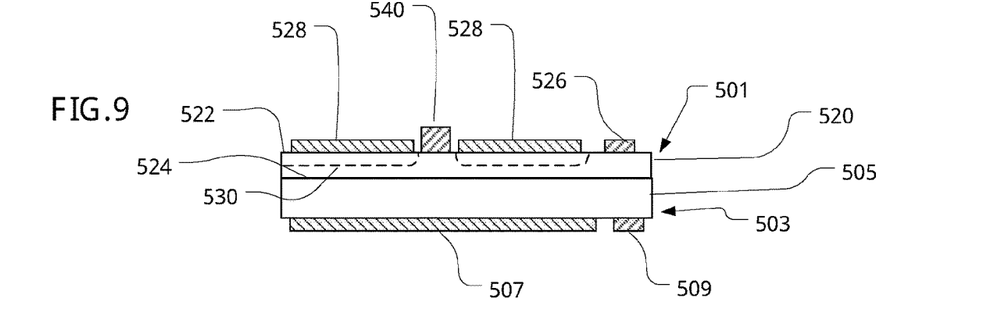
FIG. 9 is a diagrammatic sectional view depicting a multicell structure according to a still further embodiment of the invention.

The cells discussed above can be used for various purposes. However, in applications such as solar power generation, any of the cells as discussed above can be used in a multicell structure incorporating two or more cells having different bandgaps arranged in descending bandgap order, so that the cell with the widest bandgap is at the front of the structure and the cell with the narrowest bandgap is at the rear. The widest-bandgap cell is disposed in front of one or more narrower-bandgap cells. The cells can be formed separately and then mounted to one another. In other arrangements, the wider-bandgap semiconductor is grown on top of the lower-bandgap semiconductor, with or without intervening elements such as lattice matching layers. One example of a multicell structure is depicted in FIG. 9. This structure includes a first cell 501 similar to the cells discussed above, having a direct semiconductor element 520, a biasing agent 528 and collector 540 disposed on the front surface 522 of the semiconductor element. Here again, the biasing agent forms a first depletion region 530 and a collector 540 which forms a second depletion region (not shown) as discussed above. Here again, there is a continuous minority carrier channel including the first and second depletion regions. An electrode 526 is provided in contact with the wide bandgap semiconductor. The structure further includes a second cell 503 having a semiconductor element 505 disposed behind the rear face 524 of the semiconductor element 520 of first cell 501. Semiconductor element 505 of the second cell has a narrower bandgap than semiconductor element 520 of the first cell. Second cell, cell 503 includes electrodes 507 and 509 in contact with semiconductor 505. For example, cell 503 may be a conventional silicon Schottky cell or a conventional silicon pn junction cell. In a two cell structure, where the semiconductor element of the second, narrower bandgap cell is formed from silicon, the first, wider bandgap cell desirably is has a bandgap of 1.4 eV or more, more desirably 1.6 ev or more, and most desirably 1.8 ev or more.

Where the wide bandgap cell 501 has a first depletion region 530 substantially thicker than the thickness of the absorption region in semiconductor 520 as, for example, at least twice the thickness of the absorption region, essentially all of the short-wavelength photons having energy greater than the bandgap of semiconductor 520 will be absorbed within the first depletion region and converted to useful electrical energy. In this case, the thickness of the wide bandgap semiconductor element 520 (from front face 522 to rear face 524) can be much greater than the thickness of the first depletion region without loss of efficiency. However, if the thickness of the first depletion region is less than about twice the thickness of the absorption region, an appreciable portion of the short-wavelength photons will not be absorbed within the first depletion region. In this case, the thickness of the wide bandgap semiconductor element 520 desirably is less than twice the thickness of the first depletion region 530, more desirably less than 1.5 times the thickness of the first depletion region, and most desirably equal to the thickness of the first depletion region. This minimizes absorption of the short-wavelength photons in the wide bandgap semiconductor 520 outside of the first depletion region, so that those short-wavelength photons not absorbed in the first depletion region 530 can pass into the narrow bandgap cell 503 where at least some of the energy in these photons will be converted to useful electrical energy.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A photovoltaic cell comprising:
   (a) a semiconductor element formed from a direct semiconductor having front and rear faces;
   (b) a transparent biasing agent directly contacting a first portion of the front face, the biasing agent having a normal Fermi level different from the normal Fermi level of the semiconductor element such that the biasing agent produces a first depletion region in the semiconductor element;
   (c) a collector directly contacting a second portion of the front face separate from the first portion, the second portion of the front face being smaller than the first portion of the front face, the collector having a normal Fermi level different from the normal Fermi level of the semiconductor element so that the collector produces a second depletion region in the semiconductor element, the collector being out of direct conductive contact with the biasing agent but in proximity to the biasing agent, wherein the biasing agent is not conductively connected to the collector other than through the semiconductor element, there being a continuous minority carrier channel extending between the first and second depletion regions at the front face; and
   (d) an electrode contacting the semiconductor element at a location spaced apart from the depletion regions.

2. A photovoltaic cell as claimed in claim 1 wherein the semiconductor element has a first region extending from the front face to the electrode, and wherein the first region is entirely p-type or entirely n-type.

3. A photovoltaic cell as claimed in claim 2 wherein magnitude of the built-in voltage of the first depletion region is greater than the magnitude of the built-in voltage of the second depletion region.

4. A photovoltaic cell as claimed in claim 3 wherein the first region is n-type and the collector has a lower work function than the biasing agent.

5. A photovoltaic cell as claimed in claim 3 wherein the semiconductor element is selected from the group consisting of gallium arsenide and aluminum gallium arsenide, the biasing agent is silver and the collector is gold.

6. A photovoltaic cell as claimed in claim 2 wherein the electrode overlies and contacts at least a portion of the rear face of the semiconductor element.

7. A photovoltaic cell as claimed in claim 1 wherein the semiconductor element is selected from the group consisting of III-V semiconductors and II-VI semiconductors.

8. A photovoltaic cell as claimed in claim 1 wherein the collector includes a plurality of collector elements spaced apart from one another on the front face of the semiconductor element, the collector elements being conductively connected to one another, and wherein the biasing agent extends between the collector elements.

9. A photovoltaic cell as claimed in claim 8 wherein each said collector element is opaque.

10. A photovoltaic cell as claimed in claim 1 wherein the electrode is in ohmic contact with the semiconductor element.

11. A photovoltaic cell as claimed in claim 1 wherein the biasing agent has no terminal for direct conductive connection to any element external to the cell.

12. A photovoltaic cell as claimed in claim 1 wherein the biasing agent is a metal or a semiconductor, and wherein there is a gap between the biasing agent and the collector.

13. A photovoltaic cell as claimed in claim 12 wherein the first and second depletion regions merge with one another so that the first and second depletion regions form the continuous minority carrier channel.

14. A photovoltaic cell as claimed in claim 12 further comprising a dielectric having a fixed charge disposed in the gap, the dielectric forming an additional depletion region, the additional depletion region merging with the first and second depletion regions so as to form the continuous minority carrier channel.

15. A photovoltaic cell as claimed in claim 1 wherein the biasing agent is a dielectric having a fixed charge.

16. A circuit including a photovoltaic cell as claimed in claim 1 and a load electrically connected between the collector and the electrode of the photovoltaic cell, wherein the biasing agent is not conductively connected between the semiconductor element and the load.

17. A circuit including a photovoltaic cell as claimed in claim 1 and a load electrically connected between the collector and the electrode of the photovoltaic cell, wherein the biasing agent is not directly conductively connected to any element of the circuit other than the semiconductor element of the cell.

18. A multicell structure including a first photovoltaic cell as claimed in claim 1 and a second photovoltaic cell including a semiconductor element having a bandgap narrower than the bandgap of the direct semiconductor of the first photovoltaic cell, the semiconductor element of the second photovoltaic cell being disposed behind the rear face of the first photovoltaic cell.

19. A multicell structure as claimed in claim 18 wherein the first depletion region of the first photovoltaic cell has a thickness greater than the thickness of the absorption region of the direct semiconductor.

20. A multicell structure as claimed in claim 19 wherein the first depletion region of the first photovoltaic cell has a thickness less than twice the thickness of the absorption region of the direct semiconductor, and wherein the semiconductor element of the first photovoltaic cell has a thickness less than twice the thickness of the first depletion region.

21. A method of photovoltaic power generation comprising applying light to a photovoltaic cell as claimed in claim 1 while a load is connected between the collector and electrode of the cell and dissipating electrical energy generated by the cell in the load, the continuous minority carrier channel being maintained during the light-applying and dissipating steps.

* * * * *